(12) United States Patent
Sato et al.

(10) Patent No.: US 9,461,100 B2
(45) Date of Patent: Oct. 4, 2016

(54) DISPLAY DEVICE

(71) Applicant: Japan Display Inc., Tokyo (JP)

(72) Inventors: Toshihiro Sato, Tokyo (JP); Masakazu Gunji, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/924,444

(22) Filed: Oct. 27, 2015

(65) Prior Publication Data

US 2016/0118449 A1 Apr. 28, 2016

(30) Foreign Application Priority Data

Oct. 28, 2014 (JP) ................................ 2014-219280

(51) Int. Cl.
| | | |
|---|---|---|
| H01L 29/20 | (2006.01) | |
| H01L 27/32 | (2006.01) | |
| H01L 51/52 | (2006.01) | |

(52) U.S. Cl.
CPC ....... *H01L 27/3246* (2013.01); *H01L 27/3276* (2013.01); *H01L 51/5203* (2013.01); *H01L 51/5225* (2013.01); *H01L 27/3211* (2013.01)

(58) Field of Classification Search
CPC ........... H01L 27/3211; H01L 27/3246; H01L 27/3276; H01L 51/5203; H01L 51/5225
USPC ................... 257/89, 91, 43, 40, 59
See application file for complete search history.

(56) References Cited

U.S. PATENT DOCUMENTS

| | | | | |
|---|---|---|---|---|
| 2006/0044232 A1* | 3/2006 | Choi | ................... | H01L 27/3244 345/76 |
| 2010/0117077 A1* | 5/2010 | Yamazaki | ......... | H01L 29/78618 257/43 |
| 2011/0012117 A1* | 1/2011 | Yamazaki | ........... | H01L 27/1225 257/59 |
| 2012/0187425 A1* | 7/2012 | Omoto | ................ | H01L 27/3211 257/88 |
| 2014/0021459 A1* | 1/2014 | Yamazaki | ........... | H01L 27/3265 257/40 |
| 2014/0097455 A1* | 4/2014 | Ono | ....................... | H01L 27/124 257/91 |
| 2014/0124765 A1 | 5/2014 | Omoto | | |
| 2015/0060816 A1* | 3/2015 | Matsumoto | ......... | H01L 27/3246 257/40 |
| 2015/0144902 A1* | 5/2015 | Do | ....................... | H01L 27/3246 257/40 |

FOREIGN PATENT DOCUMENTS

JP 2012-155953 A 8/2012

* cited by examiner

*Primary Examiner* — Mohammed Shamsuzzaman
(74) *Attorney, Agent, or Firm* — Typha IP LLC

(57) ABSTRACT

A display device, in which self-luminous elements are arranged, prevents a leakage current through a common layer, included in the self-luminous elements and disposed throughout its image display area, from causing adjacent pixels to emit unintended light. An organic EL display device has a bank and a light-emitting element layer. The bank is formed on a substrate and is positioned in the border between first and second pixels adjacent to each other. The light-emitting element layer is deposed to spread over the first pixel, the second pixel, and the bank. A first electrode and a second electrode are formed on both sides of the light-emitting element layer and inject electric charges to the light-emitting element layer. A third electrode is formed in contact with the light-emitting element layer in an area overlapping with the bank 106 and absorbs the leakage current.

16 Claims, 11 Drawing Sheets

DISPLAY DEVICE

CROSS-REFERENCE TO RELATED APPLICATION

The present application claims priority from Japanese application JP2014-219280 filed on Oct. 28, 2014, the content of which is hereby incorporated by reference into this application.

BACKGROUND OF THE INVENTION

1. Field of the Invention

The present invention relates to a display device using self-luminous elements that emit light by application of a voltage.

2. Description of the Related Art

Display devices using self-luminous elements such as organic light-emitting electroluminescent (EL) elements have been developed. The organic electroluminescent element is a type of light-emitting diode usually called an organic light-emitting diode (OLED). The OLED emits light when carriers (electrons or holes) are injected into its light-emitting layer made of organic compounds. The OLED typically has a structure including an auxiliary layer with carrier mobility, for example, between an electrode and the light-emitting layer so that carriers are efficiently injected into the light-emitting layer during application of a voltage.

For example, a hole transport layer (HTL) and a hole injection layer (HIL), each as an auxiliary layer, are disposed between the anode and the light-emitting layer. In addition, an electron transport layer (ETL) and an electron injection layer (EIL) are disposed between the cathode and the light-emitting layer. These auxiliary layers are formed throughout an image display area in which a plurality of pixels are arranged, that is, to spread continuously over the plurality of pixels, for example, by vapor deposition.

SUMMARY OF THE INVENTION

A display device using light-emitting elements in which an auxiliary layer with carrier mobility, such as the HTL and the HIL in the OLED described above, is formed as a common layer lying continuously throughout an image display area may cause the leakage of carriers through the common layer between adjacent pixels, that is, a leakage current that flows to adjacent pixels. The leakage current that flows to adjacent pixels causes the adjacent pixels to emit unintended light. Specifically, the leakage current causes deterioration in resolution of images. Moreover, the leakage current that flows between different pixels of different luminescent colors causes deterioration in color reproducibility (color purity). In particular, as the openings (or the light-emitting areas) of adjacent pixels get closer to each other with decreasing pixel size due to higher definition, these problems become more pronounced.

The present invention provides a display device that prevents a leakage current from flowing to self-luminous elements in adjacent pixels and causing the adjacent pixels to emit unintended light.

(1) A display device according to an aspect of the present invention is a display device having a first pixel and a second pixel adjacent to the first pixel. The display device includes a substrate, a bank, a light-emitting element layer, first electrodes, a second electrode, and a third electrode. The bank is formed on the substrate and is positioned in the border between the first and second pixels. The light-emitting element layer is disposed to spread over the first pixel, the second pixel, and the bank. The first electrodes are formed, separately for the first and second pixels, on a substrate side of the light-emitting element layer. The second electrode is formed on the opposite side of the light-emitting element layer from the first electrodes to spread over the first and second pixels. The third electrode is formed on the opposite side of the bank from the substrate and in contact with the light-emitting element layer. The third electrode is positioned in an area overlapping with the bank in a plan view.

(2) A display device according to another aspect of the present invention is a display device having a plurality of pixels arranged in an image display area. The display device includes a plurality of light-emitting areas, a bank, a light-emitting element layer, pixel electrodes, a counter electrode, and a border electrode. Each of the pixels including each of the light-emitting areas. The bank is formed on a substrate and along the border of the pixels. The light-emitting element layer is formed on the substrate having the bank thereon. The light-emitting element layer has a stack of layers including a light-emitting layer for emitting light in response to injection of carriers and an auxiliary layer with carrier mobility. The light-emitting layer is formed at least in the light-emitting areas. The auxiliary layer is formed throughout the image display area. Each pixel electrode is disposed, for the corresponding pixel, under the light-emitting element layer. The counter electrode is disposed on the light-emitting element layer and applies a voltage to the light-emitting element layer together with each pixel electrode. The border electrode is disposed on the light-emitting element layer and in the border area between the pixels. The border electrode is electrically connected to the light-emitting element layer. When a potential enough to draw the carriers in the border area of the light-emitting element layer is applied to the border electrode, the border electrode absorbs the carriers.

(3) A display device according to still another aspect of the present invention is a display device having a plurality of pixels arranged in an image display area. The display device includes a plurality of light-emitting areas, a bank, a border electrode, a light-emitting element layer, pixel electrodes, and a counter electrode. Each of the pixels including each of the light-emitting areas. The bank is formed on a substrate and along the border of the pixels. The border electrode is disposed on the bank. The light-emitting element layer is formed on the substrate having the bank and the border electrode thereon. The light-emitting element layer has a stack of layers including a light-emitting layer for emitting light in response to injection of carriers and an auxiliary layer with carrier mobility. The light-emitting layer is formed at least in the light-emitting areas. The auxiliary layer is formed throughout the image display area. Each pixel electrode is disposed, for the corresponding pixel, under the light-emitting element layer. The counter electrode is disposed on the light-emitting element layer and applies a voltage to the light-emitting element layer together with each pixel electrode. The border electrode is electrically connected to the light-emitting element layer. When a potential enough to draw the carriers in the border area of the light-emitting element layer is applied to the border electrode, the border electrode absorbs the carriers.

DETAILED DESCRIPTION OF THE INVENTION

Embodiments of the present invention will now be described with reference to the accompanying drawings.

The disclosure herein is merely an example, and appropriate modifications coming within the spirit of the present invention, which are easily conceived by those skilled in the art, are intended to be included within the scope of the invention as a matter of course. The accompanying drawings schematically illustrate widths, thicknesses, shapes, or other characteristics of each part for clarity of illustration, compared to actual configurations. However, such schematic illustrations are merely examples and are not intended to limit the present invention. In the present specification and drawings, some elements identical or similar to those shown previously are denoted by the same reference signs as the previously shown elements, and thus are not described in detail herein as appropriate.

A display device in each embodiment described below is an organic EL display device. The organic EL display device is an active matrix display device and is built in televisions, personal computers, handheld devices, mobile phones, and other devices.

A plurality of pixels for producing images are arranged two-dimensionally in the image display area of the display device. Here, the direction along one coordinate axis of a two-dimensional Cartesian coordinate system corresponding to an image is defined as the row direction, and the direction along the other coordinate axis of the coordinate system is defined as the column direction. In the following description, merely for convenience, the row direction and the column direction are basically defined as the horizontal direction and the vertical direction of the image, respectively. For example, for such a display device as can switch the orientation of an image displayed in the same image display area between portrait and landscape modes, the row direction and the column direction of the image display area may be the vertical direction and the horizontal direction of the image, respectively. The structure itself of the display device can be such that its physical orientation is changed between row and column directions relative to structures described below.

Each of the following embodiments describes a display device that can display color images. The display device has a plurality of types of sub-pixels of mutually different luminescent colors arranged in its image display area. Each pixel in the color images corresponds to a sub-pixel group constituted by a plurality of types of sub-pixels in the display device, whereas a single sub-pixel is the structural unit in the display device. For example, an OLED and a pixel circuit are formed for each sub-pixel. For this reason, in the following description, each sub-pixel is basically referred to as a pixel.

First Embodiment

Figure 1:
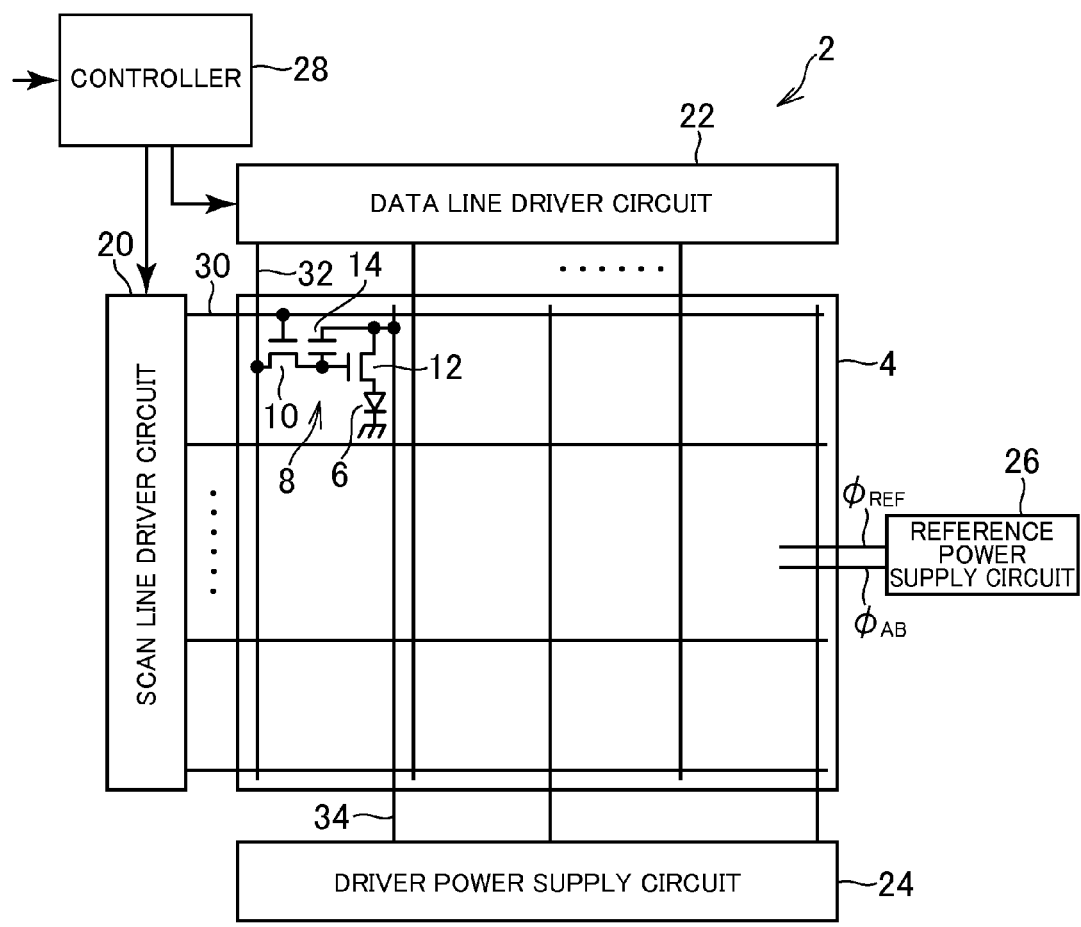
FIG. 1 is a schematic diagram showing a configuration of an organic EL display device according to an embodiment of the present invention.

FIG. 1 is a schematic diagram showing a configuration of an organic EL display device 2 according to an embodiment. The organic EL display device 2 includes a pixel array unit 4 that displays images and a driver that drives the pixel array unit 4. The organic EL display device 2 includes a substrate and a stack structure on the substrate. The substrate is made of, for example, a glass substrate or a flexible resin film. The stack structure includes thin film transistors (TFTs) and OLEDs.

In the pixel array unit 4, OLEDs 6 and pixel circuits 8, each corresponding to a pixel, are arranged in a matrix. Each pixel circuit 8 includes TFTs 10 and 12 and a capacitor 14.

The driver includes a scan line driver circuit 20, a data line driver circuit 22, a driver power supply circuit 24, a reference power supply circuit 26, and a controller 28. For example, the driver is responsible for driving the pixel circuits 8 to control the light emission of the OLEDs 6.

The scan line driver circuit 20 is connected to scan lines 30, each provided for the corresponding horizontal pixel alignment (pixel row). The scan line driver circuit 20 sequentially selects the scan lines 30 in response to timing signals input from the controller 28, and applies, to each selected scan line, a voltage enough to turn on the corresponding lighting TFT 10.

The data line driver circuit 22 is connected to data lines 32, each provided for the corresponding vertical pixel alignment (pixel column). The data line driver circuit 22 receives image signals from the controller 28. In synchronization with the selection of the scan line 30 by the scan line driver circuit 20, the data line driver circuit 22 outputs voltages, which correspond to an image signal for the selected pixel row, to the data lines 32. In the selected pixel row, each of the voltages is written into the corresponding capacitor 14 via the lighting TFT 10. Each driver TFT 12 supplies a current, which corresponds to the written voltage, to the corresponding OLED 6. Thus, the OLEDs 6 in the pixels corresponding to the selected scan line 30 emit light.

The driver power supply circuit 24 is connected to drive power lines 34, each provided for the corresponding pixel column, and supplies a current to the OLEDs 6 via the drive power lines 34 and the driver TFTs 12 in the selected pixel row.

The reference power supply circuit 26 applies a constant potential to a common electrode (not shown) constituting the cathode electrodes of the OLEDs 6, and also applies another constant potential to a border electrode (not shown) that is disposed in the border area between the pixels and is electrically connected to the OLEDs 6.

In this embodiment, the lower electrode (first electrode) of the OLED 6 is a pixel electrode formed for each pixel, and the upper electrode (second electrode) of the OLED 6 is a counter electrode disposed to face the pixel electrode. The lower electrode is connected to the driver TFT 12. In contrast, the upper electrode is constituted by the electrode common to the OLEDs 6 of all the pixels. In this embodiment, the lower electrode is the anode of the OLED 6 and the upper electrode is the cathode.

Figure 2:
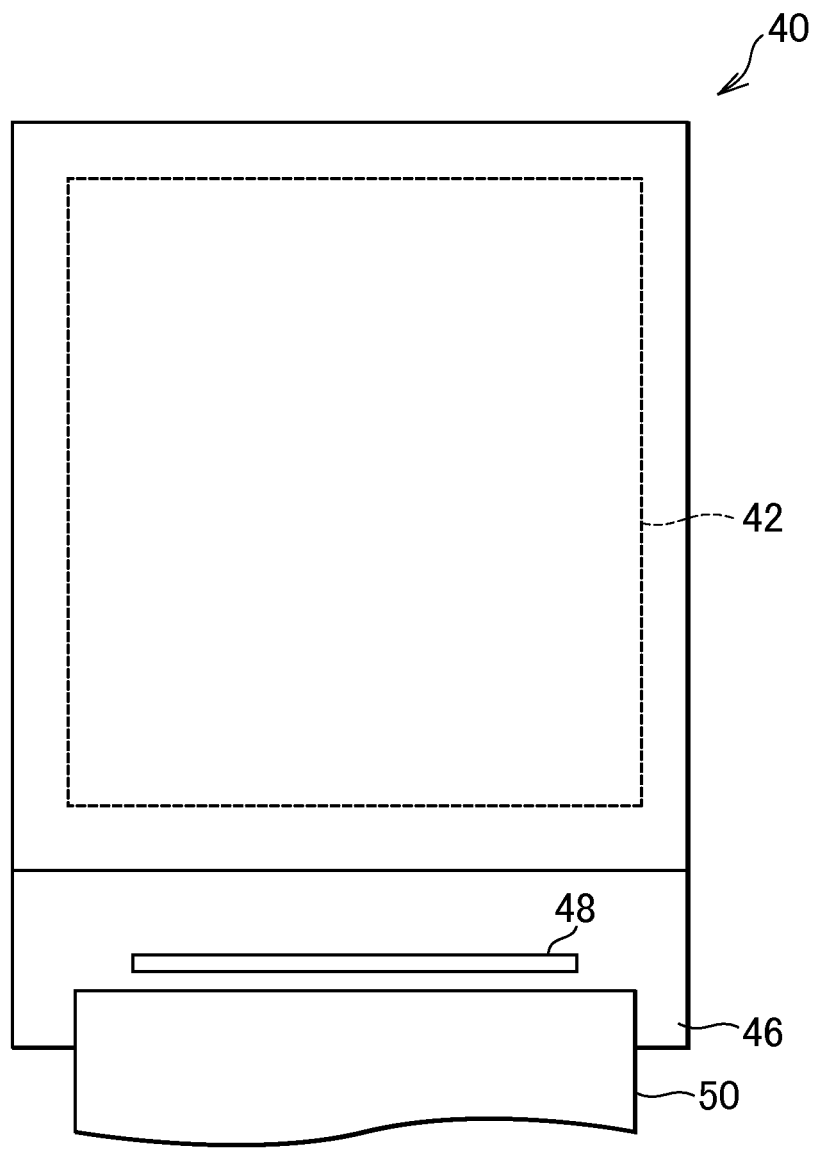
FIG. 2 is a schematic plan view of a display panel of the organic EL display device according to the embodiment of the present invention.

FIG. 2 is a schematic plan view of a display panel 40 of the organic EL display device 2. The pixel array unit 4 shown in FIG. 1 is disposed in a display area 42 of the display panel 40. As described above, the OLEDs 6 are arranged in the pixel array unit 4. A component mounting area 46 is provided near one side of the rectangular display panel 40, and wirings connected to the display area 42 are disposed on the component mounting area 46. In addition, a driver IC 48 constituting the driver is mounted on the component mounting area 46, and a FPC 50 is connected to the component mounting area 46. The FPC 50 is connected to the controller 28, the circuits 20, 22, 24, 26, and other circuits, and has an IC on its main side.

Figure 3:
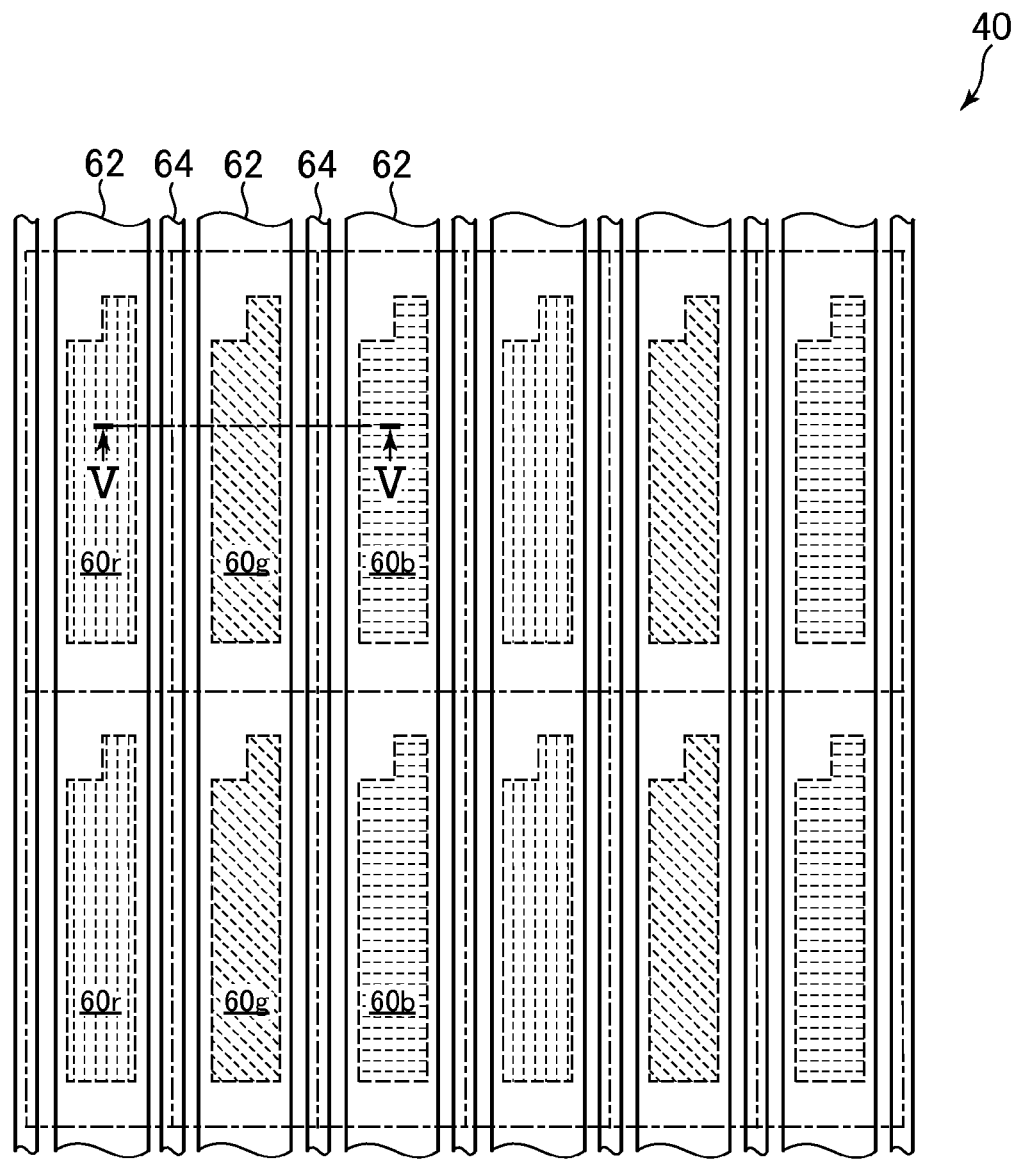
FIG. 3 is a schematic partial plan view of a display area of an organic EL display device according to a first embodiment of the present invention.

FIG. 3 is a schematic partial plan view of the display area 42. The pixels of the display panel 40 in this embodiment are arranged in a stripe matrix. Specifically, three types of pixels (sub-pixels) of luminescent colors red (R), green (G), and blue (B) are arranged cyclically in the row direction, and the same type of pixels (sub-pixels) are arranged in the column direction. In the display area 42, pixel openings 60r, 60g, and 60b to be light-emitting areas are respectively arranged to correspond to the R, G, and B pixels. Between these pixel openings, that is, in the border area between the pixels, a bank is formed.

An upper electrode 62 extends along each pixel column to cover pixel openings 60. A border electrode 64 (third electrode) extends in the border areas between adjacent pixel columns. As described above, in this embodiment, the R, G, and B pixels are arranged in a stripe matrix, so that a pair of pixels adjacent to each other in the row direction emit light mutually different in color. That is, the border electrode 64 is disposed along the borders between adjacent pixels of mutually different luminescent colors (e.g., between adjacent first and second pixels).

The organic EL display device 2 in this embodiment is a top-emitting device and thus emits light generated in the OLEDs 6 toward the upper electrode 62, which is formed of a transparent conductive material. The border electrode 64 can be formed of, for example, a conductive film at the same layer as the upper electrode 62. Specifically, a transparent conductive film throughout the display area 42 is formed on the OLEDs 6, and then the upper electrode 62 and the border electrode 64 are formed by patterning this film.

Figure 4:
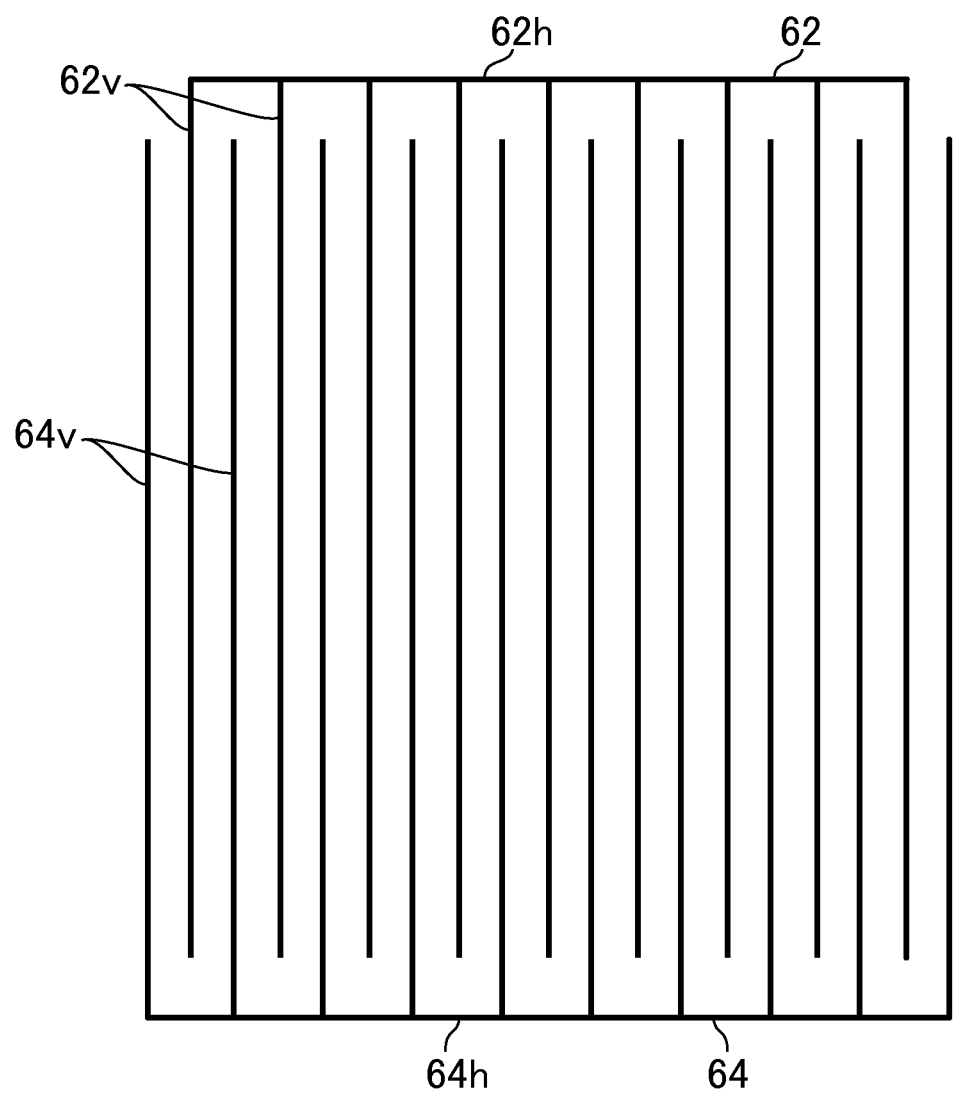
FIG. 4 is a schematic plan view showing an example layout of an upper electrode and a border electrode in the display area of the organic EL display device according to the first embodiment of the present invention.

FIG. 4 is a schematic plan view showing an example layout of the upper electrode 62 and the border electrode 64 in the display area 42. The upper electrode 62 can be formed in a comb-like planar shape having vertical portions 62v extending vertically in each pixel column, shown in FIG. 3, and a horizontal connecting portion 62h extending horizontally and connecting the vertical portions 62v to each other. That is, the upper electrode 62 has a shape with slits disposed in the borders between the pixel columns, in other words, in the areas overlapping with the bank in a plan view. Similarly, the border electrode 64 can be formed in a comb-like planar shape having vertical portions 64v extending vertically in the borders between the pixel columns, shown in FIG. 3, and a horizontal connecting portion 64h extending horizontally and connecting the vertical portions 64v to each other. The upper electrode 62 and the border electrode 64 are each connected to the reference power supply circuit 26. A common potential (reference potential $\varnothing_{REF}$) is applied to the upper electrode 62 of each pixel. A common potential (charge absorption potential $\varnothing_{AB}$) is applied to each part of the border electrode 64.

Figure 5:
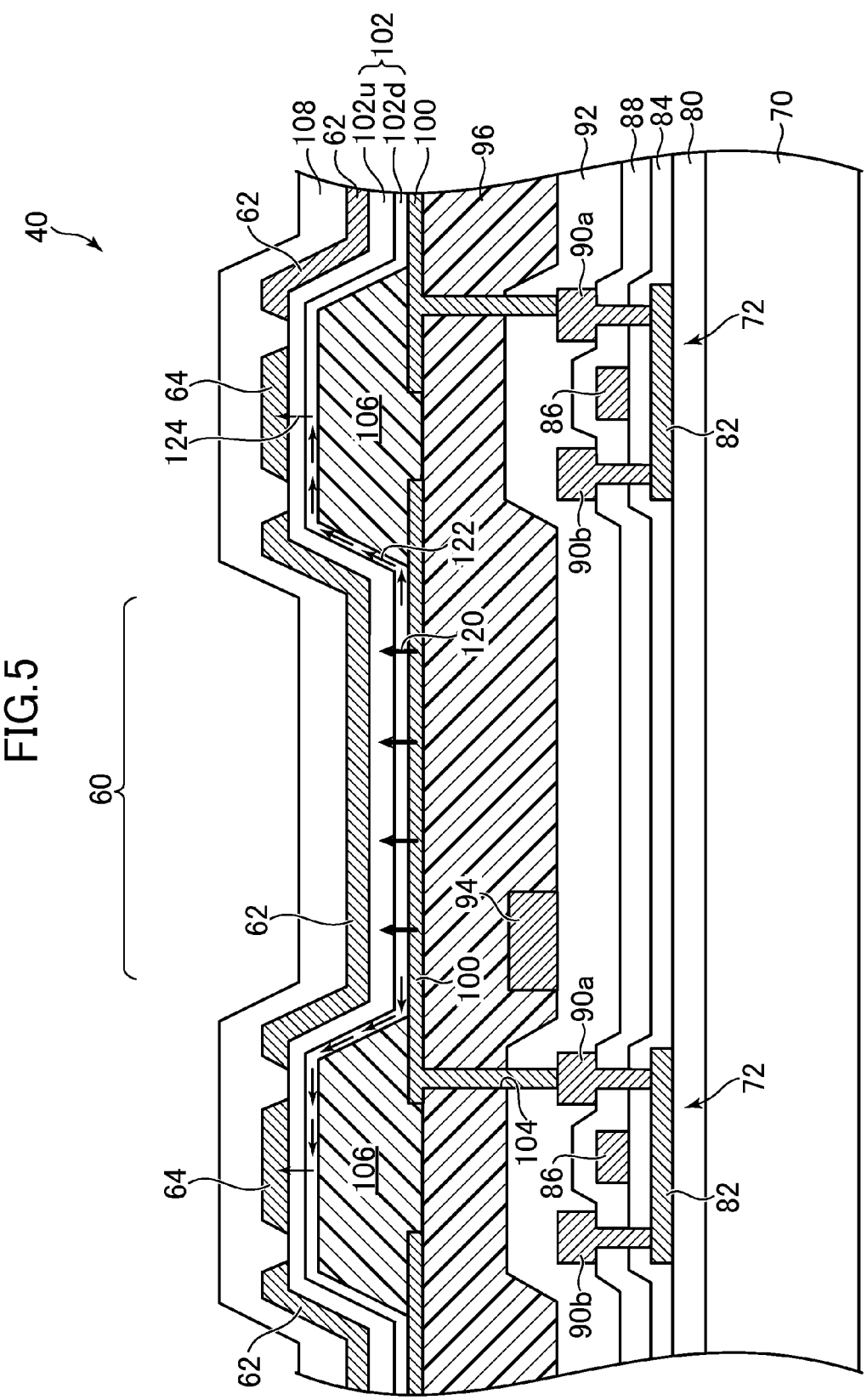
FIG. 5 is a schematic vertical cross-sectional view of a display panel according to the first embodiment of the present invention taken along line V-V shown in FIG. 3.

FIG. 5 is a schematic vertical cross-sectional view of the display panel 40 taken along line V-V shown in FIG. 3. The OLEDs 6 and a circuit including, for example, TFTs 72 are formed in the display panel 40. The structure of this display panel 40 is formed by stacking and patterning various types of layers on a substrate 70 made of glass or a resin film. The top-emitting pixel array unit 4 emits the light generated in the OLEDs 6 in the direction opposite to the substrate 70, that is, upward in FIG. 5.

Specifically, a polysilicon (p-Si) film is formed on the substrate 70 via an underlayer 80 made of an inorganic insulating material, such as silicon nitride ($SiN_y$) or silicon oxide ($SiO_x$), and then the p-Si film is patterned so that p-Si films to be regions used in a circuit layer are selectively left. For example, each p-Si film forms a semiconductor region 82 to be the channel, the source, and the drain of the top-gate TFT 72. A gate electrode 86 is disposed on the channel of the TFT 72 via a gate insulating film 84. The gate electrode 86 is formed by patterning a metal film formed, for example, by sputtering. Then, an interlayer insulating film 88 covering the gate electrode 86 is stacked. The p-Si to be the source and the drain of the TFT 72 is doped with a dopant by ion implantation. Then, a source electrode 90a and a drain electrode 90b, each electrically connected to the p-Si, are formed. After the TFT 72 is thus formed, an interlayer insulating film 92 is stacked. On the surface of the interlayer insulating film 92, interconnections 94 and other interconnections can be formed by patterning a metal film formed, for example, by sputtering. This metal film can constitute, for example, a multilayer interconnection structure including the scan lines 30, the data lines 32, and the drive power lines 34 shown in FIG. 1, together with the metal film used to form the gate electrodes 86, the source electrodes 90a, and the drain electrodes 90b. On this structure, for example, a planarization film 96 is formed by stacking an organic material, such as an acrylic resin. On the display area 42 thus planarized, the OLEDs 6 are formed.

Each OLED 6 is constituted by a lower electrode 100, a light-emitting element layer 102, and the upper electrode 62, which are stacked in this order from the substrate 70.

Assuming that the TFT 72 shown in FIG. 5 is the driver TFT 12 having an n channel, the lower electrode 100 is connected to the source electrode 90a of the TFT 72. Specifically, after the above planarization film 96 is formed, contact holes 104, each for connecting the lower electrode 100 to the corresponding TFT 72, are formed. Then, the lower electrode 100 connected to the TFT 72 is formed separately for each pixel by patterning a conductive film formed on the surface of the planarization film 96 and in the contact holes 104.

For example, the lower electrode 100 is formed of ITO or IZO. The organic EL display device 2 in this embodiment is a top-emitting device, so that the lower electrode 100 can have a structure in which a transparent conductive film is stacked on a reflective layer formed of a highly light-reflective material. For example, the reflective layer can be formed of aluminum (Al) or silver (Ag), and reflects light from the light-emitting layer toward the display surface, that is, toward the upper electrode 62.

As described above, in each pixel, the driver TFT 12 controls a current flowing through the OLED 6 in response to an image signal for the pixel, and the lower electrode 100 supplies as many carriers as correspond to the image signal for the pixel to the light-emitting element layer 102. Specifically, in this embodiment, the lower electrode 100 is the anode, and holes as carriers are supplied from the lower electrode 100 to the light-emitting element layer 102.

After the lower electrodes 100 are formed, a bank 106 is formed. The bank 106 is formed in the border area between adjacent pixels, for example, by patterning a photosensitive resin, such as acryl or polyimide, by photolithography or ink-jet printing. The bank 106 can also be formed of an inorganic insulating material, such as $SiN_y$ or $SiO_x$. The areas enclosed by the bank 106 correspond to the pixel openings 60 shown in FIG. 3, and the lower electrodes 100 are exposed through the areas.

After the bank 106 is formed, layers constituting the light-emitting element layer 102 are sequentially stacked on the lower electrodes 100. The light-emitting element layer 102 includes a light-emitting layer (EML) and an auxiliary layer. The light-emitting layer emits light in response to the injection of carriers. The auxiliary layer is responsible for efficiently supplying the carriers to the light-emitting layer. The light-emitting element layer 102 includes at least one of a HIL and a HTL as the auxiliary layer.

For example, each OLED 6 is an OLED that emits single color light corresponding to the luminescent color of one of the R, G, and B pixels, and has a structure in which the HIL, the HTL, the EML, and an ETL are stacked in this order from the lower electrode 100. In this structure, the HIL, the HTL, and the ETL are each the auxiliary layer. Among these, the HIL and the HTL are formed between the anode (lower electrode 100), which supplies holes, and the light-emitting layer (EML), throughout the display area 42, that is, to spread continuously over all the pixels. The ETL is formed between the cathode (upper electrode 62), which supplies electrons, and the light-emitting layer (EML), throughout the display area 42. The light-emitting layer (EML) is formed of different organic light-emitting materials for different luminescent colors.

Alternatively, the OLEDs 6 may be white light-emitting OLEDs. In this case, a color filter is disposed over the OLEDs 6 and allows light of different colors corresponding to different pixels to exit through it. For example, the OLED 6 that emits white light can have a tandem structure in which a plurality of light-emitting element layer 102 of different luminescent colors are electrically and serially connected via light-transmissive intermediate layers. In the tandem structure, a charge generation layer (CGL) disposed as an intermediate layer is also an auxiliary layer with carrier mobility, like the HIL and the HTL.

FIG. 5 distinguishably shows a lower layer 102d including the HIL and the HTL, and an upper layer 102u including the EML and the ETL, which constitute the light-emitting element layer 102. The upper layer 102u may further include an EIL.

For example, the HTL and HIL is formed of poly(3,4-ethylenedioxythiophene):poly(styrenesulfonate) (PEDOT:PSS) or other conductive organic materials.

The upper electrode 62 and the border electrode 64 are formed together on the light-emitting element layer 102. As shown in FIG. 5, the upper electrode 62 is formed on the pixel openings 60, and the edge of the upper electrode 62 overlaps with the edge of the bank 106. The border electrode 64 is formed on the bank 106.

A sealing film 108 is formed on the surfaces of the upper electrode 62 and the border electrode 64. The sealing film 108 prevents moisture from entering and is responsible for protecting the OLEDs 6. As the sealing film 108, for example, a $SiN_y$ film is deposited by CVD.

Although not shown in FIG. 5, the top of the upper electrode 62 may be covered and planarized with an organic film, and then the sealing film 108 may be formed to cover the entire surface. The sealing film 108 may have a stack structure including a plurality of inorganic films and organic films. In addition, a protective film may be formed on the sealing film 108 to increase the mechanical strength of the surface of the display panel 40. Alternatively, on the sealing film 108, such a substrate (counter substrate) as the substrate 70 can be disposed (and bonded to the substrate 70). In this case, the space between the counter substrate and the sealing film 108 may be filled with a filler.

As described above, when the organic EL display device 2 is driven, carriers corresponding to an image signal are supplied to the light-emitting layer (EML), and the OLED 6 of each pixel emits light. In FIG. 5, arrows schematically indicate the flow of holes that are carriers supplied from the lower electrode 100 to the light-emitting element layer 102 when the organic EL display device 2 is driven. A potential lower than that of the lower electrode 100 is applied to the upper electrode 62. The holes supplied from the lower electrode 100 of each pixel to the lower layer 102d of the light-emitting element layer 102 are drawn to the upper layer 102u of the light-emitting element layer 102 and are injected into the light-emitting layer (EML) of the pixel as indicated by arrows 120, basically by an electric field between the lower electrode 100 and the upper electrode 62 disposed to face the lower electrode 100.

On the other hand, some of the holes supplied from the lower electrode 100 to the lower layer 102d travel through the lower layer 102d as indicated by arrows 122 and become the above-described leakage current, which flows to adjacent pixels. The organic EL display device 2 absorbs holes to be this leakage current as indicated by an arrow 124 into the border electrode 64. This prevents a leakage current from flowing to adjacent pixels and causing the adjacent pixels to emit light. Thus, deterioration in resolution of images is reduced. Disposing the border electrode 64 in the borders between adjacent pixels of mutually different luminescent colors can prevent color mixture due to the leakage current, provide high color purity, and thus achieve desirable color reproducibility.

To absorb holes to be the leakage current into the border electrode 64, the charge absorption potential $\emptyset_{AB}$ applied to the border electrode 64 is set to a potential enough to draw, in the border area between the pixels, carriers traveling toward the adjacent pixels through the light-emitting element layer 102. Specifically, in this embodiment, to absorb the holes, the charge absorption potential $\emptyset_{AB}$ is set to a potential lower than that of the lower electrode 100.

In addition, to effectively absorb the carriers, the difference between the charge absorption potential $\emptyset_{AB}$ applied to the border electrode 64 and the potential of the lower electrode 100 is preferably set to be greater than the difference between the reference potential $\emptyset_{REF}$ applied to the upper electrode 62 and the potential of the lower electrode 100. That is, setting the charge absorption potential $\emptyset_{AB}$ to a potential lower than the reference potential $\emptyset_{REF}$ makes the holes to be the leakage current likely to be absorbed into the border electrode 64. For example, the reference potential $\varnothing_{REF}$ can be set to 0 V, and the charge absorption potential $\varnothing_{AB}$ can be set to −2 V.

The potential of the portion of the lower layer 102d that is facing the gaps between the upper electrode 62 and the border electrode 64 is higher than the potential of the portion of the lower layer 102d that is facing the upper electrode 62 or the border electrode 64, which can form a potential barrier against the travel of the holes. That is, when viewed in the direction of travel of the leakage current, the potential barrier due to the gaps between the upper electrode 62 and the border electrode 64 can be formed before the portion facing the upper electrode 62 of the adjacent pixels. Even if the charge absorption potential $\varnothing_{AB}$ is not less than the reference potential $\varnothing_{REF}$, such an effect can prevent a leakage current from flowing to the adjacent pixels.

When each OLED 6 has the tandem structure, the border electrode 64 also absorbs holes traveling to the adjacent pixels through the charge generation layer (CGL), and thus prevents a leakage current through the CGL.

In the above description, the upper electrode 62 and the border electrode 64 are formed by patterning the conductive film at the same layer, whereas both of the electrodes can be formed in separate steps. In this case, the border electrode 64 can be formed of a conductive material different from that of the upper electrode 62. For example, the border electrode 64 can be formed using a material with lower resistance than a transparent conductive material, such as ITO or IZO, or an opaque material. For example, the border electrode 64 formed of an opaque metal can reduce light leakage to the adjacent pixels and prevent color mixture.

Modification of First Embodiment

The above first embodiment describes how the border electrode 64 prevents the leakage current in the organic EL display device 2 in which the R, G, and B pixels are arranged in a stripe matrix, whereas such a structure for preventing the leakage current can be applied to other pixel arrangements.

Figure 6:
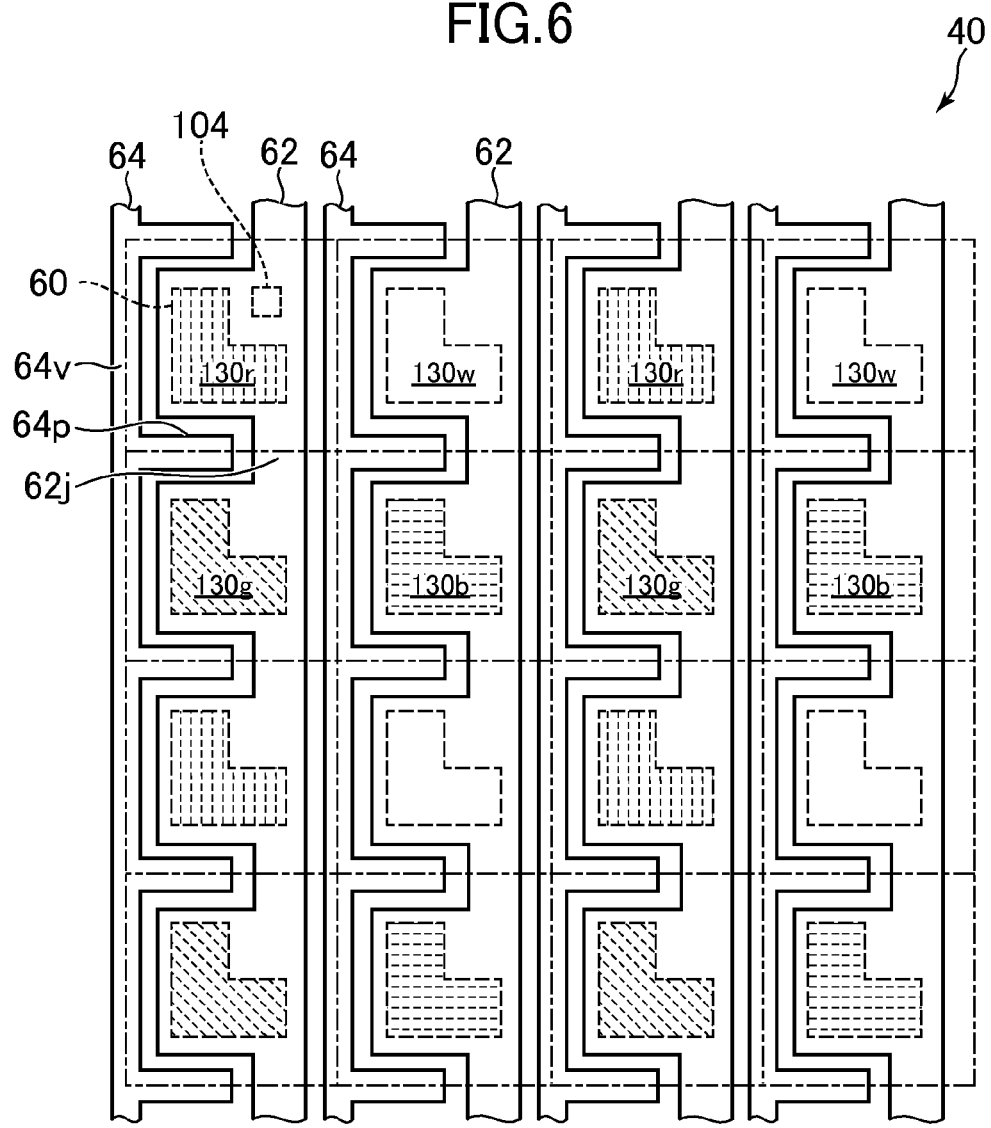
FIG. 6 is a schematic partial plan view of a display area of an organic EL display device according to a modification of the first embodiment of the present invention.

FIG. 6 is a schematic partial plan view of the display area 42 of an organic EL display device 2a according to a modification of the first embodiment. In the display area 42 of the organic EL display device 2a, four types of pixels of different luminescent colors are arranged in a matrix, and four pixels arranged in a two-by-two matrix emit light mutually different in color. The four types of pixels are arranged so that two types are arranged alternately in each odd row and the other two types are arranged alternately in each even row, or so that two types are arranged alternately in each odd column and the other two types are arranged alternately in each even column. Specifically, in the example shown in FIG. 6, the four types of luminescent colors are R, G, B, and white (W). For example, R pixels 130r alternate with W pixels 130w in each odd row, and G pixels 130g alternate with B pixels 130b in each even row. The combinations of two types of luminescent colors in each row or each column are not limited to the example shown in FIG. 6.

For the stripe arrangement in the first embodiment, pixels of the same color are arranged in the column direction. Thus, no leakage current between pixels adjacent to each other in the column direction causes deterioration in picture quality due to color mixture. That is why the first embodiment shows the example where the border electrode 64 is arranged only in the border areas between the pixel columns and not arranged in the border areas between the pixel rows.

In contrast, for the pixel arrangement shown FIG. 6, it is preferable to prevent color mixture by preventing leakage currents both between adjacent pixels in the row direction and between adjacent pixels in the column direction. To this end, for example, in addition to the vertical portions 64v (extending portions) vertically extending in the borders between the pixel columns and the horizontal connecting portion 64h, which are shown in FIG. 3, the border electrode 64 has horizontal projecting portions 64p projecting from each vertical portion 64v along the borders between the pixel rows to prevent both the leakage currents in the row and column direction.

As the upper electrode 62 and the border electrode 64 are formed of the conductive film at the same layer here, the upper electrode 62 needs to have, in the borders between the pixel rows, connecting portions 62j constituting part of the upper electrode 62 between adjacent pixels in the column direction. Accordingly, the horizontal projecting portions 64p (projecting portions) are formed not entirely along the borders between adjacent pixels in the column direction but only partially along the borders.

It is difficult to form the lower electrodes 100 to lie flat on the contact holes 104. Thus, for example, in FIG. 5, the contact holes 104 are formed not within the areas of the pixel openings 60 but within the border area in which the bank 106 is disposed. However, finer pixels may unable the contact holes 104 to be accommodated within the border area. In the pixel layout shown in FIG. 6, each pixel opening 60 is formed in an L shape that is a rectangle partially cut away, and one of the contact holes 104 and the corresponding part of the bank 106 are formed in the missing area. Such a pixel layout has wider gaps and narrower gaps between the pixel openings 60, in the borders between adjacent pixels in the column direction. For this reason, the horizontal projecting portions 64p are disposed in the narrower gaps between the pixel openings 60, thus preventing the leakage current well. In addition, the connecting portions 62j are disposed in the wider gaps between the pixel openings 60, thus extending the upper electrode 62 in the column direction.

Second Embodiment

The following describes an organic EL display device 2b according to a second embodiment of the present invention. This embodiment differs from the above first embodiment in the border electrode 64 and its associated structure, whereas the other portions are essentially the same between these embodiments. The following describes the second embodiment mainly on differences from the first embodiment.

Figure 7:
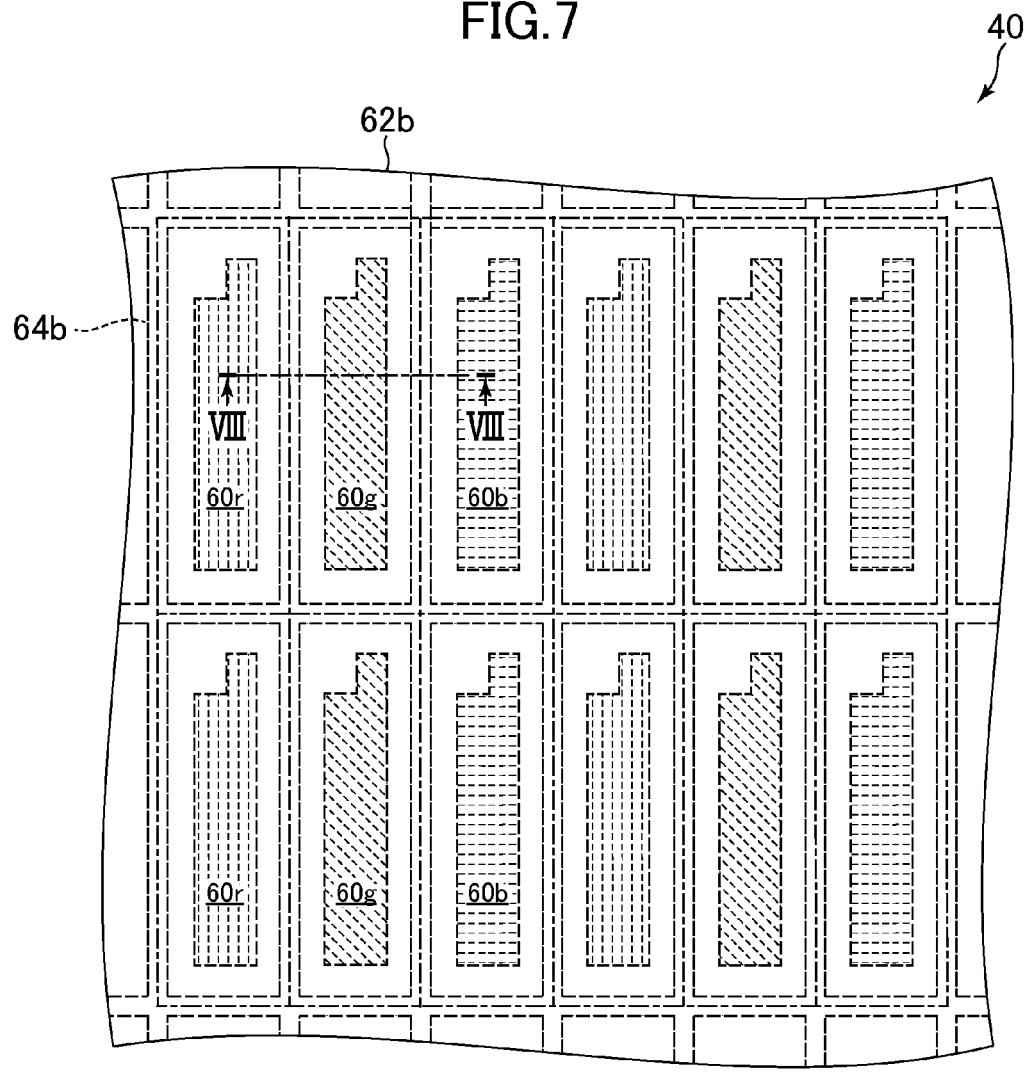
FIG. 7 is a schematic partial plan view of a display area of an organic EL display device according to a second embodiment of the present invention.
Figure 8:
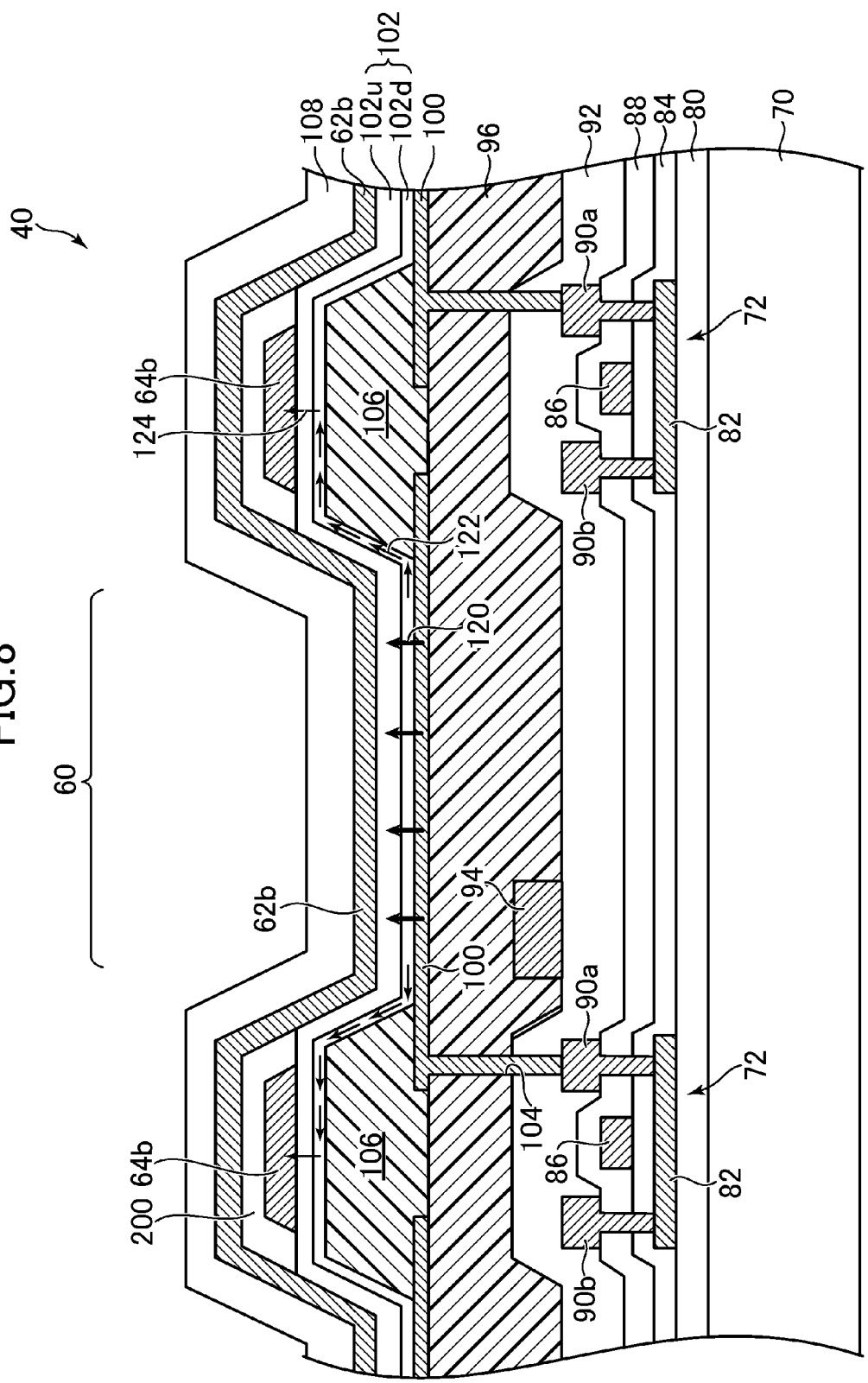
FIG. 8 is a schematic vertical cross-sectional view of a display panel according to the second embodiment of the present invention taken along line VIII-VIII shown in FIG. 7.

FIG. 7 is a schematic partial plan view of the display area 42 of the display panel 40 of the organic EL display device 2b. FIG. 8 is a schematic vertical cross-sectional view of the display panel 40 taken along line VIII-VIII shown in FIG. 7. The organic EL display device 2b includes the display panel 40 in which R, G, and B pixels are arranged in a stripe matrix, as in the first embodiment.

In this embodiment, the upper electrode 62 and the border electrode 64 are formed of different conductive films. This provides more flexibility in the planar shapes of both of the electrodes. Specifically, a border electrode 64b is formed in contact with the top surface of the light-emitting element layer 102 on the bank 106, and then an upper electrode 62b is formed. This structure enables the border electrode 64b to be disposed along the entire circumference of the pixel border enclosing each pixel. That is, the border electrode 64b has a grid-like planar shape and is disposed not only in the border areas between the pixel columns but also in the border areas between the pixel rows. On the other hand, the upper electrode 62b can be formed also on the border electrode 64b and is basically formed in common throughout the display area 42. An insulating film 200 is formed in the region sandwiched between the upper electrode 62b and the border electrode 64b.

Also according to this embodiment, as in the first embodiment, a leakage current through an auxiliary layer with carrier mobility, such as the HTL and HIL, is prevented from causing adjacent pixels to emit light. This embodiment enables the border electrode 64 to be disposed along the entire circumference of the pixel border enclosing each pixel, and thus can better prevent the leakage current from flowing to the adjacent pixels.

The border electrode 64b can be formed of a conductive material different from that of the upper electrode 62b. As described in the first embodiment, the border electrode 64b can be formed using a material with lower resistance than a transparent conductive material, such as ITO or IZO, or an opaque material. For example, the border electrode 64b formed of an opaque metal can reduce light leakage to the adjacent pixels and prevent color mixture.

This embodiment can be easily applied to such a pixel arrangement other than the stripe arrangement as described in the modification of the first embodiment.

Third Embodiment

The following describes an organic EL display device 2c according to a third embodiment of the present invention. This embodiment differs from the above first and second embodiments in the border electrode 64 and its associated structure, whereas the other portions are essentially the same between these embodiments. The following describes the third embodiment mainly on differences from the embodiments described above.

Figure 9:
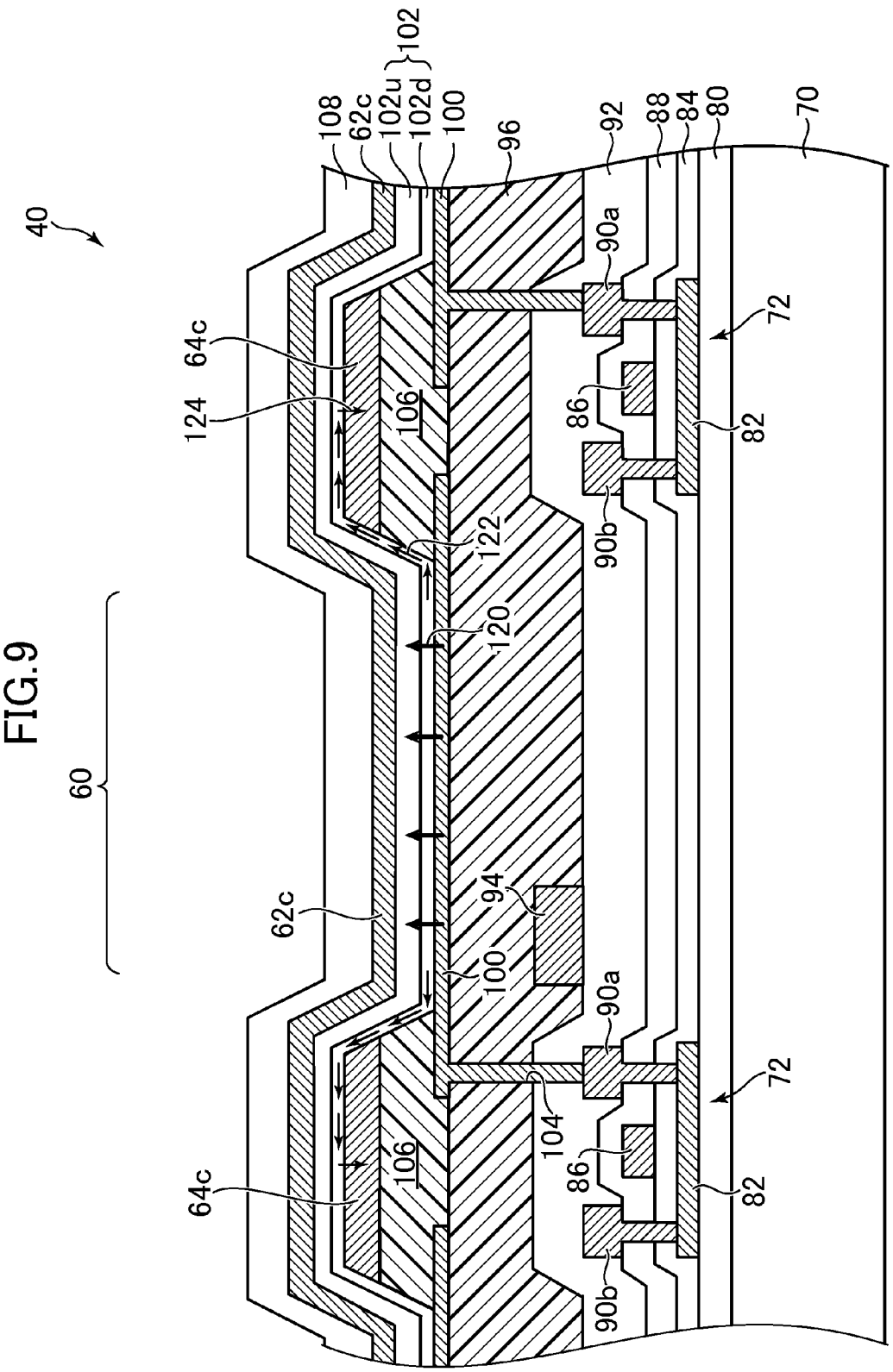
FIG. 9 is a schematic vertical cross-sectional view of a display panel according to a third embodiment of the present invention taken along line VIII-VIII shown in FIG. 7.

A schematic partial plan view of the display area 42 of the display panel 40 of the organic EL display device 2c is essentially the same as that shown in FIG. 7 for the second embodiment. Thus, the third embodiment also refers to FIG. 7. FIG. 9 is a schematic vertical cross-sectional view of the display panel 40 of the organic EL display device 2c taken along line VIII-VIII shown in FIG. 7.

As in the second embodiment, the upper electrode 62 and the border electrode 64 in this embodiment are formed of different conductive films. This provides more flexibility in the planar shapes of both of the electrodes. For example, as in the second embodiment, a border electrode 64c has a grid-like planar shape along the pixel border, and an upper electrode 62c is basically formed in common throughout the display area 42.

This embodiment differs from the second embodiment in that the border electrode 64c is disposed under the light-emitting element layer 102. That is, the border electrode 64c is disposed on the top surface of the bank 106, and then the light-emitting element layer 102 and the upper electrode 62 are stacked sequentially.

As shown in FIG. 9, it is preferable that the border electrode 64c and the bank 106 are integrally formed into a grid-like plateau shape in which the border electrode 64c has approximately the same tapered sides as those of the bank 106 and is disposed on the entire top surface of the bank. This enables the light-emitting element layer 102 stacked on the border electrode 64c to coat the pixel border area well without any problem such as disconnection caused by a step. In addition, it is more preferable to eliminate corners or steps on the surface of the pixel border area, for example, to pattern the border electrode 64c by etching such as wet etching to round off the edge of the border electrode 64c.

Also according to this embodiment, as in the second embodiment, a leakage current through an auxiliary layer with carrier mobility, such as the HTL and HIL, is well prevented from causing adjacent pixels to emit light.

In many cases, the HTL and the HIL included in the lower layer 102d, among the auxiliary layers, are formed relatively thicker than the ETL and the EIL included in the upper layer 102u. As a result, most of the carriers to be the leakage current travel through the lower layer 102d. In this embodiment shown in FIG. 9, the border electrode 64 is in contact with the lower layer 102d, that is, in contact with the HIL or the HTL. Thus, the carriers can be efficiently absorbed from the lower layer 102d, and the leakage current through the lower layer 102d can be prevented well.

The border electrode 64c can be formed of a conductive material different from that of the upper electrode 62c, for example, a low-resistance metal.

This embodiment can also be easily applied to such a pixel arrangement other than the stripe arrangement as described in the modification of the first embodiment.

Figure 10:
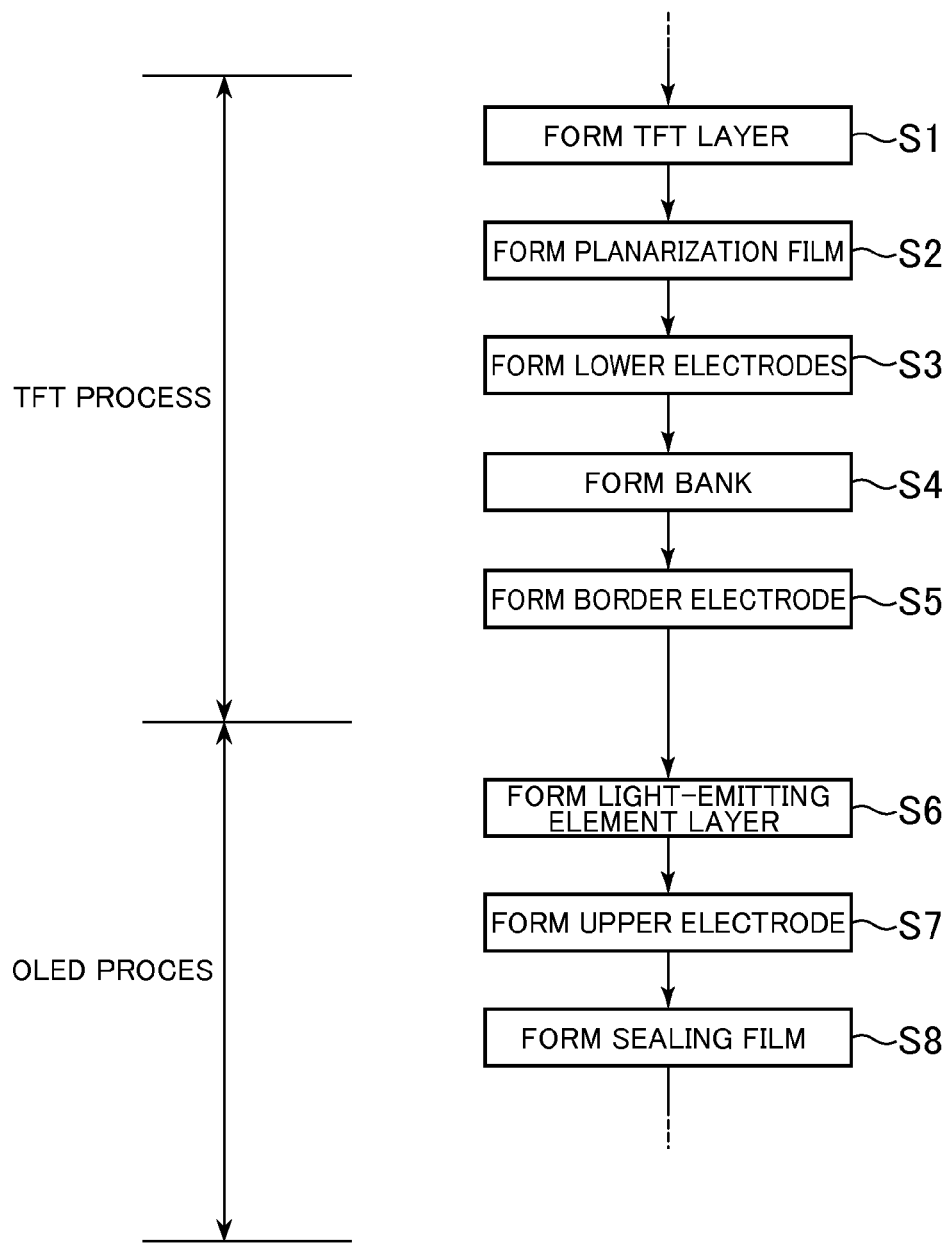
FIG. 10 is a schematic flowchart of a process for manufacturing the display panel according to the third embodiment of the present invention.

FIG. 10 is a schematic flowchart of a process for manufacturing the display panel 40 according to this embodiment. In manufacture of the display panels 40, a method for forming a plurality of display panels 40 at once on a large piece of substrate 70 is adopted to increase the manufacturing efficiency. In this manufacturing method, during a process for forming TFTs on the substrate, the plurality of display panels 40 are processed together. On the other hand, during an OLED formation process, the plurality of display panels 40 are processed separately. That is, this manufacturing method is divided into the former and latter processes. In the former process, the plurality of display panels 40 are processed with all connected. In the latter process, the plurality of display panels 40 are divided into individual panels and the remaining processing is then applied to them. Here, the former process is referred to as the TFT process, and the latter process is referred to as the OLED process.

The TFT process basically includes steps that can be performed by using semiconductor manufacturing processes for manufacturing, for example, integrated circuits. The TFT process has a relatively high degree of flexibility in process conditions. For instance, a manufacturing process can be designed to use a high-temperature process at several hundred degrees Celsius. On the other hand, in the OLED process, the ambient temperature can be limited to several tens of degrees Celsius to prevent deterioration of the light-emitting element layer made of an organic material. That is, in the OLED process, processing the display panels 40 individually increases the number of steps, and the process conditions need to be controlled more accurately than the TFT process. Thus, by increasing the proportion of the TFT process in the process for manufacturing the display panels 40 and by reducing the proportion of the OLED process, the display panels 40 can be manufactured at lower costs and in shorter time periods.

In this embodiment, the TFT process includes a step of forming a circuit having the TFTs 72 on the substrate 70 (Step S1), a step of stacking the planarization film 96 on the circuit (Step S2), a step of forming the lower electrodes 100 (Step S3), and a step of forming the bank 106 (Step S4). These steps can be performed as in the first embodiment.

In this embodiment, the TFT process further includes a step of forming the border electrode 64c (Step S5), and thus can effectively reduce the above manufacturing costs and shorten the above manufacturing time periods. For example, after the bank 106 is formed in the border area, a conductive film is formed throughout the display area 42, and then the border electrode 64c is formed by patterning the conductive film using photolithography.

The OLED process includes steps subsequent to formation of the border electrode 64c. Specifically, the OLED process includes, for example, a step of forming the light-emitting element layer 102 (Step S6), a step of forming the upper electrode 62c (Step S7), and a step of forming the sealing film 108 (Step S8).

Also according to this embodiment, as in the above embodiments, a leakage current through an auxiliary layer with carrier mobility, such as the HTL and HIL, is prevented from causing adjacent pixels to emit light. This embodiment enables the border electrode 64 to be disposed along the entire circumference of the pixel border enclosing each pixel, and thus can better prevent the leakage current from flowing to the adjacent pixels.

This embodiment can be easily applied to such a pixel arrangement other than the stripe arrangement as described in the modification of the first embodiment.

Modification of Third Embodiment

Figure 11:
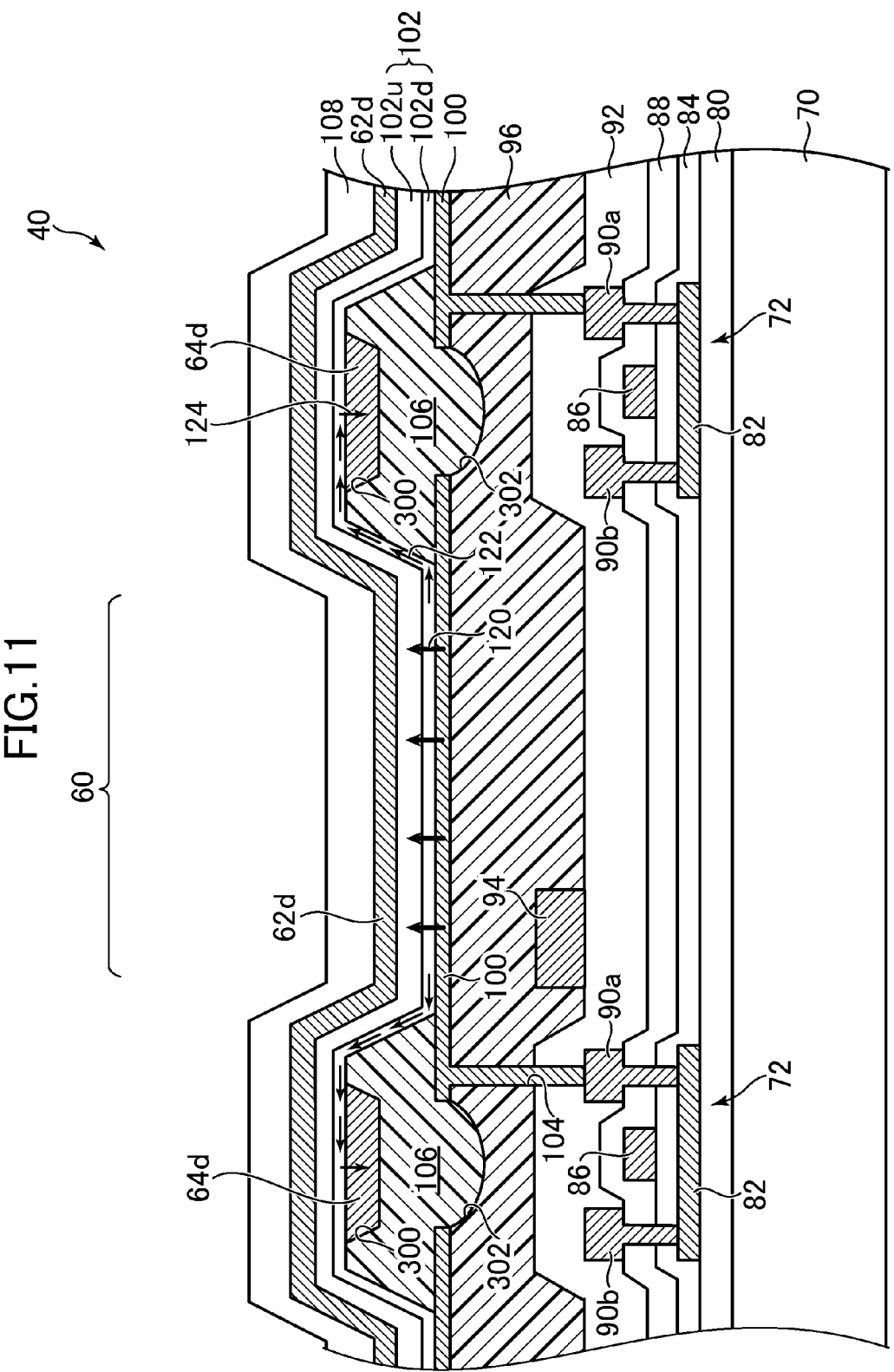
FIG. 11 is a schematic vertical cross-sectional view of a display panel according to a modification of the third embodiment of the present invention taken along line VIII-VIII shown in FIG. 7.

FIG. 11 is a schematic vertical cross-sectional view of the display panel 40 of an organic EL display device 2d according to a modification of the third embodiment, which is taken along line VIII-VIII shown in FIG. 7 as in the third embodiment.

In this modification, a recess 300 is formed on the upper surface of the bank 106 and is then filled with a border electrode 64d. For example, the border electrode 64d can be formed using a nano-ink containing nanoparticles made from, for example, Ag. The nano-ink is applied to the recess 300 by ink-jet printing so that the recess is filled with the nano-ink, and then made less likely to flow for example, by drying under reduced pressure. Subsequently, the nano-ink layer is dissolved and baked by heat treatment. Filling the recess 300 with the border electrode 64d smooths the surface of the pixel border area after formation of the border electrode 64d, and thus allows the pixel border area to be coated with the light-emitting element layer 102.

The recess 300 can be formed by etching after the bank 106 is formed. Alternatively, as shown in FIG. 11, after a recess 302 is formed on part of the surface of the planarization film 96 on which the bank 106 is to be disposed, the bank 106 can be stacked to form the recess 300 on the top surface of the bank 106. For example, the recess 302 of the planarization film 96 can be formed by etching in patterning the lower electrode 100.

The above embodiments and modifications describe cases where the lower electrode 100 is the anode of the OLED 6 and the upper electrode 62 is the cathode of the OLED 6. However, the present invention can also be applied to a case where the lower electrode 100 is the cathode of the OLED 6 and the upper electrode 62 is the anode of the OLED 6. In that case, the layers in the light-emitting element layer 102 are stacked in the reverse order of the above structure. For example, the light-emitting element layer 102 has a structure in which the EIL, the ETL, the EML, the HTL, and the HIL are stacked in this order from the lower electrode 100 used as the cathode. As will be understood by those skilled in the art, the direction of current and the magnitude relation between potentials are basically reversed relative to the above embodiments.

Those skilled in the art can appropriately modify the design of the organic EL display devices 2 (including 2a, 2b, 2c, and 2d) described above as embodiments of the present invention and implement other organic EL display devices, and all such organic EL display devices also fall within the scope of the invention as long as they come within the spirit of the invention. Display devices other than the organic EL display devices, for example, quantum dot display devices that employs quantum dot elements as their light-emitting layer, also fall within the scope of the invention.

Various other variations and modifications can be conceived by those skilled in the art within the spirit of the present invention, and it will be understood that all such variations and modifications also fall within the scope of the invention. For example, those skilled in the art can appropriately modify the above embodiments by addition, deletion, or design change of components, or by addition, omission, or condition change of steps, and all such modifications also fall within the scope of the invention as long as they come within the spirit of the invention.

It will also be understood that other effects produced by an aspect of the embodiment, which are apparent from the description herein or can be appropriately conceived by those skilled in the art, are produced by the present invention as a matter of course.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device having a first pixel and a second pixel adjacent to the first pixel, the display device comprising:
   a substrate;
   a bank on the substrate, the bank being positioned in a border between the first and second pixels;
   a light-emitting element layer spreading over the first pixel, the second pixel, and the bank;
   a first electrode on a substrate side of the light-emitting element layer, the first electrode being formed individually for each of the first and second pixels and electrically connected to a source of a respective driving thin film transistor for each of the first and second pixels;
   a second electrode on an opposite side of the light-emitting element layer from the first electrode, the second electrode spreading over the first and second pixels; and
   a third electrode on an opposite side of the bank from the substrate and in contact with the light-emitting element layer, the third electrode being positioned in an area overlapping with the bank in a plan view;
   wherein the second electrode applies a common reference potential to the pixels, the first electrode supplies as many carriers as correspond to an image signal for each pixel to the light-emitting element layer, and
   a potential to make a potential difference between the third electrode and the first electrode greater than a potential difference between the first electrode and the reference potential is applied to the third electrode.

2. The display device according to claim 1, wherein
   the second electrode has a slit in the area overlapping with the bank, and
   the third electrode is positioned in the slit and at the same layer as the second electrode.

3. The display device according to claim 2, wherein
the first pixel is adjacent to a third pixel in a direction different from a direction in which the first pixel is adjacent to the second pixel,
the third electrode has an extending portion extending along the border between the first and second pixels and a projecting portion projecting from the extending portion, and
the projecting portion is positioned at least part of a border between the first and third pixels.

4. The display device according to claim 1, wherein
the third electrode is positioned on an opposite side of the light-emitting element layer from the substrate and is covered with an insulating film in the area overlapping with the bank, and
the second electrode covers the third electrode via the insulating film in the area overlapping with the bank.

5. The display device according to claim 1, wherein
the third electrode is positioned between the light-emitting element layer and the bank.

6. The display device according to claim 5, wherein
a recess is formed on a top surface of the bank, and
the third electrode fills the recess.

7. The display device according to claim 5, wherein
the light-emitting element layer has at least a light-emitting layer and a hole transport layer, and
the third electrode is in contact with the hole transport layer.

8. The display device according to claim 5, wherein
the light-emitting element layer has at least a light-emitting layer and a hole injection layer, and
the third electrode is in contact with the hole injection layer.

9. A display device having a plurality of pixels arranged in an image display area, the display device comprising:
a plurality of light-emitting areas, each of the pixels including each of the light-emitting areas;
a bank on a substrate and along a border of the pixels; a light-emitting element layer on the substrate, the light-emitting element layer having a stack of layers including a light-emitting layer and an auxiliary layer, the light-emitting layer being formed at least in the light-emitting areas and emitting light in response to injection of carriers, the auxiliary layer having carrier mobility and spreading over pixels;
a plurality of pixel electrodes under the light-emitting element layer, each of the pixel electrodes being disposed in each of the pixels and electrically connected to a source of a respective driving thin film transistor for each of the plurality of pixels;
a counter electrode on the light-emitting element layer;
a border electrode on the light-emitting element layer and in a border area between the pixels, the border electrode being electrically connected to the light-emitting element layer,
wherein, when a potential enough to draw the carriers in the border area of the light-emitting element layer is applied to the border electrode, the border electrode absorbs the carriers;
Wherein the counter electrode applies a common reference potential to the pixels,
the pixel electrode supplies as many carriers as correspond to an image signal for each pixel to the light-emitting element layer, and
a potential to make a potential difference between the border electrode and the pixel electrode greater than a potential difference between the pixel electrode and the reference potential is applied to the border electrode.

10. A display device having a plurality of pixels arranged in an image display area, the display device comprising:
a plurality of light-emitting areas, each of the pixels including each of the light-emitting areas;
a bank on a substrate and along a border of the pixels; a border electrode on the bank; a light-emitting element layer on the substrate, the light-emitting element layer having a stack of layers including a light-emitting layer and an auxiliary layer, the light-emitting layer being formed at least in the light-emitting areas and emitting light in response to injection of carriers, the auxiliary layer having carrier mobility and spreading over pixels;
a plurality of pixel electrodes under the light-emitting element layer, each of the pixel electrodes being disposed in each of the pixels and electrically connected to a source of a respective driving thin film transistor for each of the plurality of pixels;
a counter electrode on the light-emitting element layer, wherein
the border electrode is electrically connected to the light-emitting element layer, and
when a potential enough to draw the carriers in the border area of the light-emitting element layer is applied to the border electrode, the border electrode absorbs the carriers;
wherein the counter electrode applies a common reference potential to the pixels,
the pixel electrode supplies as many carriers as correspond to an image signal for each pixel to the light-emitting element layer, and
a potential to make a potential difference between the border electrode and the pixel electrode greater than a potential difference between the pixel electrode and the reference potential is applied to the border electrode.

11. The display device according to claim 9, wherein
the border electrode is formed at the same layer as the counter electrode.

12. The display device according to claim 9, wherein
the counter electrode is made of a transparent conductive material formed throughout the image display area and applies a common reference potential to the pixels,
the pixel electrode supplies as many carriers as correspond to an image signal for each pixel to the light-emitting element layer, and
the border electrode is made of an opaque conductive material formed under the counter electrode.

13. The display device according to claim 10, wherein
the counter electrode applies a common reference potential to the pixels,
the pixel electrode supplies as many carriers as correspond to an image signal for each pixel to the light-emitting element layer,
the light-emitting element layer has, as the auxiliary layer, a carrier transport layer or a carrier injection layer for the carriers supplied from the pixel electrode, and
the light-emitting layer is stacked on the auxiliary layer.

14. The display device according to claim 10, wherein
the bank has a recess on a top surface thereof, and
the border electrode fills the recess.

15. The display device according to claim 9, wherein
the image display area includes a plurality of types of the pixels of different luminescent colors, and
the border electrode is disposed along at least part of a border between each pair of the pixels of different luminescent colors.

16. The display device according to claim 10, wherein
the image display area includes a plurality of types of the
  pixels of different luminescent colors, and
the border electrode is disposed along at least part of a
  border between each pair of the pixels of different
  luminescent colors.

\* \* \* \* \*